Dec. 16, 1969

I. A. LESK 3,484,308

SEMICONDUCTOR DEVICE

Original Filed April 10, 1963

INVENTOR.
Israel Arnold Lesk

BY Mueller & Aichele

ATTY'S.

United States Patent Office 3,484,308

Patented Dec. 16, 1969

3,484,308

SEMICONDUCTOR DEVICE

Israel Arnold Lesk, Scottsdale, Ariz., assignor to Motorola, Inc., Chicago, Ill., a corporation of Illinois Original application Apr. 10, 1963, Ser. No. 271,952, now Patent No. 3,345,221, dated Oct. 3, 1967. Divided and this application Apr. 7, 1967, Ser. No. 647,262

Int. Cl. H01l *5/00*

U.S. Cl. 148—33.5 2 Claims

ABSTRACT OF THE DISCLOSURE

A semiconductor body having a first region of one conductivity type adjacent a portion of one surface of the body, a second region of the opposite conductivity type surrounding the first region at the surface of the body and a third region of the opposite conductivity type adjoining the first two regions below the surface of the body, the third region having a lower resistivity than the second region.

This application is a divisional application of application Ser. No. 271,952, filed Apr. 10, 1963, now U.S. Patent No. 3,345,221, and assigned to the present assignee.

This invention relates to the semiconductor art and particularly to planar junction devices having improved avalanche characteristics.

The planar PN junction is formed by selective diffusion and is of a form such that the edge of the diffused junction terminates at the surface of the semiconductor substrate. Surface effects at the edge of the junction often cause avalanche breakdown to occur there at a lower voltage than would be expected according to the impurity concentration gradients of the bulk region. Avalanche breakdown at the surface is often highly variable with the conditions under which the semiconductor device is operated and as a result the junction may show a large degree of instability.

For stable operation of the device in or near the avalanche breakdown region, it is desirable to have the minimum voltage at which surface avalanche breakdown can occur be higher than that of the bulk. This causes avalanche breakdown to occur preferentially in the more stable bulk regions of the junction.

Accordingly, it is the object of this invention to improve the stability of PN junctions with respect to avalanche breakdown by causing it to occur preferentially in the bulk material.

The invention features a planar junction structure such that the impurity concentration gradient of the junction at the surface is significantly smaller than in the bulk so that avalanche breakdown preferentially occurs in the bulk.

The present invention, briefly summarized, consists of preparing planar PN junctions so that impurity concentration gradients at the surface are smaller than those for the junction within the more stable bulk material. Thus, when a sufficiently high reverse voltage is applied across the junction, avalanche breakdowns occurs in the bulk portion of the junction.

Under such conditions, avalanche breakdown occurs at about the same voltage regardless of some surface conditions which ordinarily might tend to cause it to occur at a different voltage depending on the operating environment.

Figure 1:
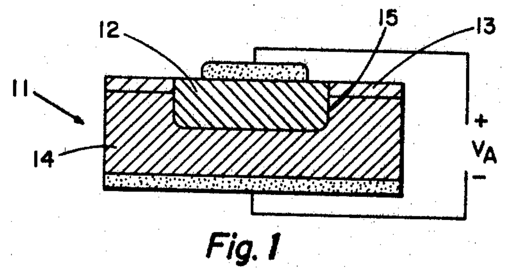
FIG. 1 shows the active element of a planar diode with a junction having a high resistivity P region peripheral about a planar N diffused region and with a lower resistivity P region beneath the other regions.

The diode 11 shown in FIG. 1 has a structure in accordance with this invention. The N region 12, formed by selective diffusion, is planar and has its complete junction periphery terminating at the surface of the chip. The chip is composed of two layers of P-type material 13 and 14. The lower region 14 has the lower resistivity and the bottom of the N region 12 extends into this material. The upper layer of higher resistivity P material 13 surrounds the N region 12 at the surface as well as somewhat below the surface. Under reverse bias, $V_A$, high enough for avalanche voltage to occur in the bulk, the junction region 15 at the surface will not be ready to break down if the resistivity of the upper P region 13 is suitably high. The resistivity of the P region 13 is considered suitably high when its corresponding breakdown voltage, neglecting surface effects, exceeds $V_A$ by an amount great enough so that probable surface effects tending to lower the breakdown voltage are unable to lower it below $V_A$.

Figures 2A, 2B, 2C, 2D, 3A, 3B, 3C, 3D:
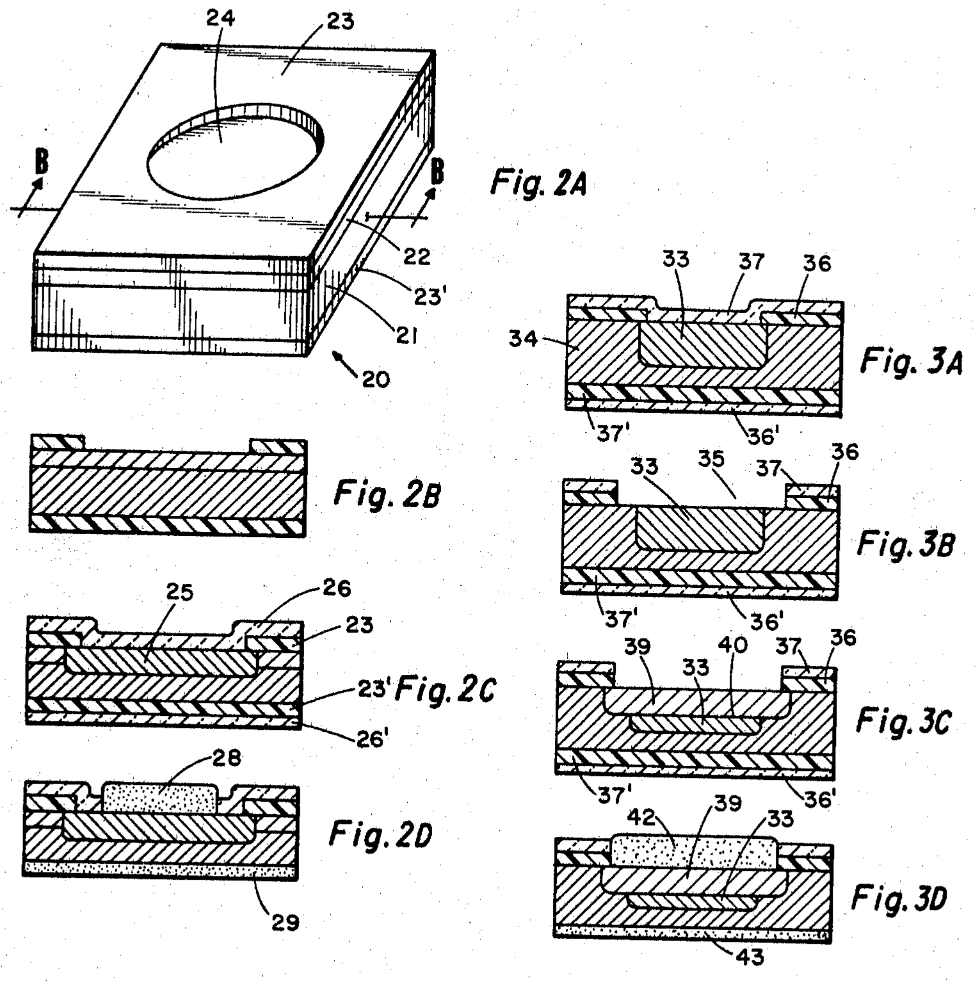
FIG. 2 shows the steps in preparing an embodiment of this invention.
FIG. 3 shows the preparation of another embodiment in which two selective diffusion operations are used to form the desired junction structure.

FIGS. 2A and 2B show a substrate or chip of P-type silicon 21 on which a layer of high resistivity P-type silicon 22 has been grown by epitaxial methods. Subsequently, a film of silicon dioxide 23 and 23' was thermally grown on top and bottom surfaces of the wafer and an opening 24 placed in the silicon dioxide 23 preparatory to forming an N region by selective diffusion. The N region 25 (FIG. 2C) is formed deeply enough to pass through the high resistivity P region 22 and into the lower resistivity P region 21. The glass film 26 and 26' was grown to form the impurity source for the N-type diffusion. After the diffusion step (not shown), the glass 26' and oxide 23' is lapped or etched from the bottom surface and an opening made in the glass 26 covering the N region. Contacts of metal 28 and 29 are formed on the N region (FIG. 2D) and the bottom surface of the wafer by vacuum metallizing. Subsequently, the active element is assembled to a suitable header and sealed or otherwise encapsulated.

FIG. 3A through FIG. 3D show another method of preparing a junction in which avalanche breakdown occurs preferentially in the bulk semiconductor material. By selective diffusion a low resistivity P region 33 is formed on a P-type chip 34 and a circular region 35 on the chip is stripped of silicon dioxide 36 and glass 37 to a diameter slightly larger and concentric with the diameter of the diffused region. An N region 39 is formed by diffusion through the opening in the films to form the PN junction 40 which is adjacent high resistivity material at the surface and low resistivity beneath. Contacts of metal 42 and 43 to the N region 39 and the chip are formed and the device assembled as in the manner of the first embodiment.

The sequence in which the two selective diffusions forming regions 33 and 39 are performed is not critical. The larger diameter N region may be diffused first and then the small P+ region diffused through it if desired. Additionally, for the embodiments of the invention, the active elements and the methods described for their preparation have been for n-p junctions, however, p-n junctions of the analogous structure are as readily prepared and in a similar manner and it is intended that the scope of the invention include them.

In accordance with this invention, semiconductor devices with PN and NP junctions having improved stability at or near avalanche breakdown voltages may be prepared.

I claim:

1. A semiconductor device comprising, a body of semiconductor material having a first region of one conductivity type at a surface thereof, a second region of the opposite conductivity type peripheral about the first region at said surface, a third region also of said opposite conductivity type adjoining said first and second regions below said surface, said second and third regions together forming a rectifying junction with said first region, and said third region being of lower resistivity than said second region so that avalanche breakdown of said junction tends to occur beneath the surface of said body.

2. A semiconductor device comprising, a body of semiconductor material having a first region of one conductivity type at a surface thereof, a second region of the opposite conductivity type surrounding said first region at said surface, a third region also of said opposite conductivity type adjoining said first and second regions below said surface, said second and third regions together forming a rectifying junction with said first region which junction extends to said surface, said third region being of lower resistivity than said second region so that avalanche breakdown of said junction tends to occur beneath the surface of said body, and a protective insulating coating on said surface entirely covering the portion of said junction at said surface.

References Cited

UNITED STATES PATENTS 3,194,699 7/1965 White ............. 148—33.5

L. DEWAYNE RUTLEDGE, Primary Examiner

R. A. LESTER, Assistant Examiner

U.S. Cl. X.R.

148—33; 317—234, 235